United States Patent
Cayson et al.

[11] Patent Number: 5,214,250
[45] Date of Patent: May 25, 1993

[54] METHOD OF REWORKING CIRCUIT PANELS, AND CIRCUIT PANELS REWORKED THEREBY

[75] Inventors: Burtran J. Cayson, Austin, Tex.; John A. Covert, Binghamton, N.Y.; Steven A. Duncan, Austin, Tex.; John M. Lauffer, Waverly, N.Y.; Issa S. Mahmoud, Apalachin, N.Y.; Richard A. Schumacher, Endicott, N.Y.

[73] Assignee: International Business Machines Corporation, Armonk, N.Y.

[21] Appl. No.: 762,201

[22] Filed: Sep. 19, 1991

[51] Int. Cl.$^5$ .............................. H05G 1/00
[52] U.S. Cl. ........................ 174/250; 29/846
[58] Field of Search ............ 174/250, 251, 268; 29/846, 848, 850, 402.01

[56] References Cited

U.S. PATENT DOCUMENTS

| | | |
|---|---|---|
| 4,310,811 | 1/1982 | Currie .................... 333/1 |
| 4,438,561 | 3/1984 | Mueller . |
| 4,654,102 | 3/1987 | Wery et al. ............ 156/250 |
| 4,731,704 | 3/1988 | Lochner ................ 361/400 |
| 4,864,723 | 9/1989 | Griffith et al. . |
| 4,866,507 | 9/1989 | Jacobs et al. . |

OTHER PUBLICATIONS

IBM TDB, vol. 15, No. 1, Jun. 1972, Printed-Circuit Card Rework Process S. Picard.
Circuits Manufacturing, "Screen Printing Engineering Changes on PCBs" vol. 19, No. 11, pp. 22-26, Nov. 1979.
IBM TDB, vol. 20, No. 4, Sep. 1977, Reworking of Component Bearing Cards A. F. Kozik.
IBM TDB, vol. 18, No. 7, Dec. 1975, "Circuit Overlay Adapter Assembly For Circuit Changes", W. D. Saucier.

Primary Examiner—Leo P. Picard
Assistant Examiner—Cheryl R. Figlin
Attorney, Agent, or Firm—Richard M. Goldman

[57] ABSTRACT

Disclosed is a method of reworking a circuit panel, and a reworked circuit panel structure. The method includes providing a conformal, polymeric, dielectric coating or coatings on the surface of the panel, providing conductive circuitization atop the conformal, polymeric, dielectric coating or coatings on the surface of the panel, and providing a top conformal, polymeric, dielectric coating atop the conductive circuitization layer. Also disclosed is a rerouted circuit panel having at least two surface features that are connected by a rerouted current lead. The current lead is formed of a dielectric encapsulated conductor electrically joining the two surface features. The dielectric encapsulated conductor structure includes a conformal, polymeric dielectric bottom layer adherent to a surface of the circuit board, with a provided conductor on the conformal, polymeric dielectric layer, and a conformal, polymeric dielectric layer provided atop the provided conductor. The polymeric dielectric bottom layer may include one or more layers atop one another.

7 Claims, 2 Drawing Sheets

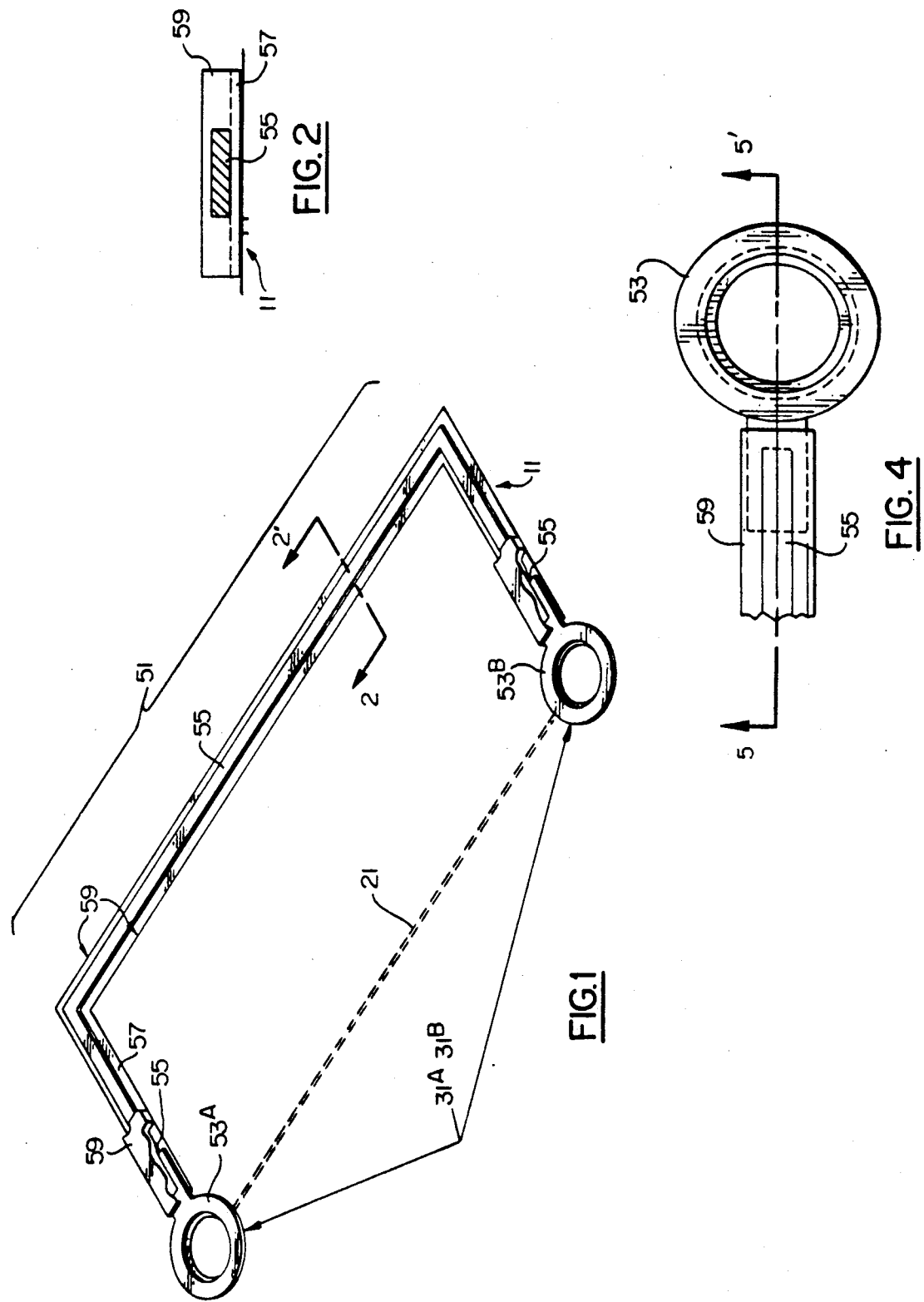

METHOD OF REWORKING CIRCUIT PANELS, AND CIRCUIT PANELS REWORKED THEREBY

FIELD OF THE INVENTION

The invention relates to circuit panels, and more particularly to a low cost method of post fabrication circuit changing, repairing, and rerouting. The method includes depositing (for example, screening) and curing one or more conformal, polymeric, dielectric coating on the surface of the panel, depositing conductive circuitization atop the cured conformal, polymeric, dielectric coating on the surface of the panel, and depositing a conformal, polymeric, dielectric coating atop the conductive circuitization layer.

BACKGROUND OF THE INVENTION

The general structures and manufacturing processes for electronic packages, including the use of positive photoresists in the fabrication of electronic packages, are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the zeroth and first level packages, i.e., the chip and chip modules. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, attachment to the second level package provides for thermal management of the chip and module, i.e., heat dissipation. The primary purpose of the package remains electrical interconnection.

At various times in the life-cycle of a microelectronic package, it is necessary to reroute the electrical interconnection of the package, that is, to reroute wiring leads. This may be the result of engineering changes, for example to accommodate new chip sets. Alternatively, rerouting may be necessary to correct manufacturing defects, for example to provide alternative signal pathways around unintentional open circuits, or to take unintentional short circuits out of the circuit network.

Typically circuit rerouting is made by abrading or "cutting" surface circuitization on one side of the panel, and running jumpers on the surface of the package between vias and through-holes previously connected by the now abraded or "cut" wiring. Other methods of rerouting involve joining insulated jumper wires to appropriate surface features on the package or panel.

One method of rerouting interconnections is described in J. Canavan, Screen Printing Engineering Changes on PCBs: Polymer Thick Film Materials Replace Hand Wiring, Circuits *Manufacturing*, Vol. 19 (No. 11), pages 22–26, November 1979. This paper describes a screen printing system, utilizing low temperature thick film materials, to overlay new circuits on the surface of finished, but unpopulated, microelectronic circuit packages. As described by Canavan, the process, called "WINK" (wire ink), allows conductive circuitization to be "screened" on the panel over a previously applied dielectric layer. This dielectric layer insulates the pre-existing circuitry from the re-routed circuitry.

According to Canavan, the process begins with an inspection of all incoming boards, followed by "cutting" all of the surface circuitization paths that are to be rerouted, for example because of engineering changes or defects. An epoxy dielectric is applied to the surface, except for openings at pads and lands. Conductor paths are screened onto the cured dielectric layer. Next, 60:40 Pb:Sn solder paste is screened over the conductor paths. The process is completed by reflowing the solder.

Another rerouting process is described by S. Picard, Printed Circuit Card Rework Process, IBM Technical *Disclosure Bulletin*, Vol. 15 (No. 1), pp. 246–247, (June 1972). Picard describes a rework process which uses two plastic sheets of PTFE, a dielectric, soldered to the microelectronic circuit panel. According to Picard, existing conductive paths are eliminated, for example, by milling, and two sheets of dielectric are used to implement new conductive paths.

The first sheet, which carries no circuitization, only pads and lands, is laid on the microelectronic circuit panel. The second sheet, which carries circuitization on both surfaces is laid atop the first sheet. Both sheets have vias at locations corresponding to vias and lands on the microelectronic circuit panel. To define a new path, the needed vias on the circuitized sheet are "opened", and unneeded lands are eliminated, for example, by milling. All unneeded lands are eliminated from the uncircuitized sheet, except for those needed for reworks, changes, etc. The two sheets are aligned, and then soldered to the backside of the microelectronic circuit panel.

An alternative rerouting process is shown in A. F. Kozik, Reworking of Component Bearing Cards, IBM Technical *Disclosure Bulletin*, Vol. 20, No. 4, pp. 1532–1533 (September 1977). Kozik describes reworking a microelectronic circuit panel by removing unneeded components, breaking wired connections, and thereafter adding new components to the component bearing surface of the microelectronic circuit panel. The changes are made on what Kozik characterizes as a new printed circuit.

This new printed circuit is a sheet of a thin, flexible material, carrying a printed circuit pattern. The pattern is on the side of the flexible film facing away from the microelectronic circuit panel. The flexible film has a solder tab at each point at which it is to be bonded to a corresponding land on the microelectronic circuit panel, and soldered to the back surface of the panel.

An alternative method of rerouting is described in W. D. Saucier, Circuit Overlay Adapter Assembly For Circuit Changes, *IBM Technical Disclosure Bulletin*, Vol. 18, No. 7, pp. 2050-2051 (December 1975). Saucier describes reworking a microelectronic circuit panel by connecting the panel to a circuitization carrying overlay. The circuitization carrying overlay is a non-adherent, "stand-off" panel, connected to appropriate lands on the panel by elastomeric pins.

U.S. Pat. No. 4,438,561 to Richard W. Mueller for METHOD OF REWORKING PRINTED CIRCUIT BOARDS describes a method of connecting electrically unconnected conductors on a microelectronic circuit panel with conductors on a flexible circuit element. The patent describes forming a flexible circuit element having a non-conductive substrate with a predetermined circuit pattern thereon. The flexible element has at least two through holes.

This flexible circuit is aligned with respect to the circuit pattern, with the circuitization on the flexible element facing the pcb and being separated therefrom by an interleaved sheet of uncircuitized dielectric (element 24).

An electrically conductive path is then established between the previously unconnected elements on the microelectronic circuit panel via the circuitization on the attached flexible carrier.

A further alternative method of rerouting is described in U.S. Pat. 4,310,810 to Thomas Currie for REWORKABLE MULTI-LAYER PRINTED CIRCUIT BOARD. Currie describes multi-layer microelectronic circuit panels having a rework layer. The rework layer has a plurality of insulated wires, that is, wires that are insulated from each other and the microelectronic circuit panel. The wires each have a characteristic impedance, Z, that matches the impedance of an internal conductive plane.

The insulated wires can be semi-permanently attached to the rework layer. Semi-permanent adhesion is said to be achieved by a heat activated thermoplastic adhesive.

A further method of rerouting is described in U.S. Pat. No. 4,654,102 to Jean C. Wrey, Michel Jehay, and Andre Job for METHOD FOR CONNECTING PRINTED CIRCUIT BOARDS. In this patent preformed, high melting wire is formed, and deposited on the insulating panel.

Another method of rerouting is described in U.S. Pat. No. 4,731,704 to Anton Lochner for ARRANGEMENT FOR MODIFYING ELECTRICAL PRINTED CIRCUIT BOARDS. Lochner utilizes a non-conformal carrier, spaced from the microelectronic panel.

The above mentioned methods of rerouting wiring, repairing wiring, and making engineering changes fail to provide an inexpensive, low cost method of making engineering changes and repairs to microelectronic circuit panels, that can be carried out in the field, and are not particularly useful in making individual, customized engineering changes.

OBJECTS OF THE INVENTION

It is one object of the invention to provide an inexpensive, low cost method of making engineering changes and repairs to microelectronic circuit panels.

It is another object of the invention to provide a method of effecting engineering changes and wiring rerouting in the field.

It is still another object of the invention to provide a method of making individual, customized engineering changes.

SUMMARY OF THE INVENTION

Disclosed is a method of reworking a circuit panel, i.e., a card or board, and a reworked circuit panel structure. The method includes depositing sequentially depositing and curing one or more conformal, polymeric, dielectric coating layers on the surface of the panel, depositing conductive circuitization atop the conformal, polymeric, dielectric coating layer or layers on the surface of the panel, and depositing and curing a conformal, polymeric, dielectric top coating atop the conductive circuitization layer.

Also disclosed is a rerouted circuit panel having at least two surface features that are connected by a rerouted current lead. The current lead is formed of a dielectric encapsulated conductor electrically joining the two surface features. The dielectric encapsulated conductor structure includes a conformal, polymeric dielectric layer adherent to a surface of the circuit board, with a deposited conductor on the conformal, polymeric dielectric layer, and a conformal, polymeric dielectric layer deposited atop the deposited conductor.

THE FIGURES

The invention may be understood by reference to the FIGURES appended hereto.

FIG. 1 is a perspective view of the circuitization line to be replaced, the polymer thick film replacement circuitization line, and a section 2-2' through the polymer thick film replacement circuitization line.

FIG. 2 is a cross-sectional view of the polymer thick film replacement line through plane 2—2" of FIG. 1.

FIG. 4 is a plan view of the carrier land, the replacement land, circuitization lead, and the encapsulating polymer.

DETAILED DESCRIPTION OF THE INVENTION

The invention disclosed herein is a deposited polymer thick film method of reworking a circuit panel (as a circuit board or card), and a reworked circuit panel structure including deposited thick film polymeric rerouting wires.

Figure 3:
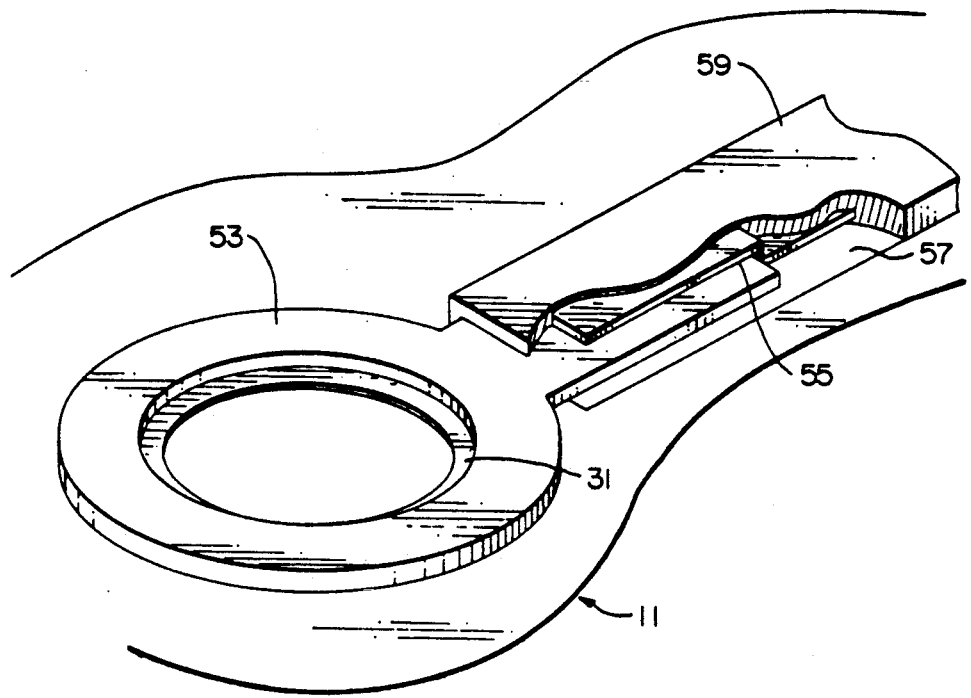
FIG. 3 is an expanded view of the land of the polymer thick film replacement line, showing the circuit lead, the replacement land, the carrier land, and the encapsulating polymer.
Figure 5:
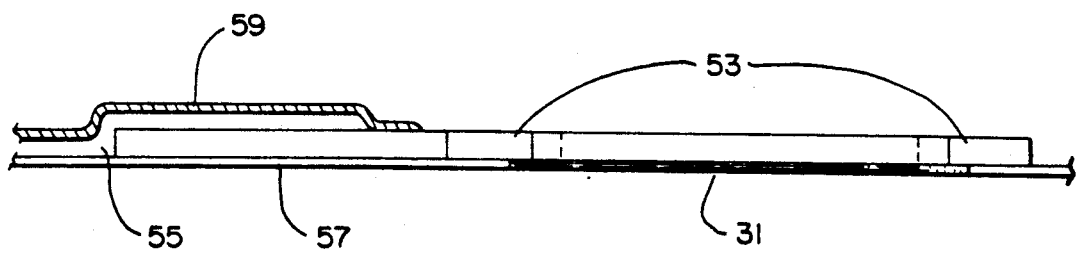
FIG. 5 is a cross sectional view of the carrier land, the replacement land, circuitization lead, and the encapsulating polymer.

The polymer thick film jumper wire structure adherent to and forming a new layer or partial layer or layers of the multi-layer circuit panel is shown in FIGS. 1 through 5.

FIG. 1 shows a microelectronic circuit panel 11 having original circuitization 21 thereon, shown between surface features, as lands 31a and 31b, or surface mount devices, or wire stubs or pins, or the like. It is desired to reroute circuitization between these two lands 31a and 31b, and remove circuitization 21. According to the invention, rerouted circuitization 51 is provided on the microelectronic circuit panel 11 between the at least two surface features 31a and 31b.

The rerouted circuitization 51, shown in FIGS. 1, 2, 3, 4, and 5, includes a pair of terminators, as circular lands 53a and 53b superimposed over the panel lands 31a and 31b. The circular lands 53a and 53b include contact portions overlaid by a conductive wire 55. This conductive wire 55 is carried by, and deposited on, a conformal polymeric dielectric layer or layers 57 and overlaid by a conformal polymeric dielectric top layer 59.

The dielectrics, adherent to the underlaying structure, allow a plurality of crossing rerouted circuitization wires 51 to be superimposed one above the other. In this way, a number of reroutings may be accomplished.

FIG. 2 is a cross-sectional view of the rerouted circuitization structure 51 through plane 2—2' of FIG. 1. FIG. 2 shows the underlying microelectric circuit panel 11, with the conductive wire 55. This conductive wire 55 is carried by, and deposited on, a conformal first dielectric 57 and overlaid by a conformal second dielectric 59.

The conductive lands 53a, 53b, are formed of conductive material, such as formed eyelets of Cu. The conductive wire 55, is a conductive deposit of a conductive metal, as copper or silver. The conductors 55 are typically about 10 to 20 mils wide and about 0.5 to 1.0 mil thick. They may be deposits or preforms of Cu or Ag. In one embodiment the conductors 55 are formed of "Minico 5000" silver paste, deposited between the bottom polymeric dielectric layer or layers 57 and the top polymeric dielectric layer 59.

The conformal bottom polymeric dielectric layer or layers 57, and the conformal top polymeric dielectric 59, an overcoat layer dielectric, are typically about 0.5 to 1.0 mil thick, surrounding and encapsulating the conductive wire or layer 55. Typical polymers include phenolics, epoxies, polyimides, and the like. The preferred polymeric dielectrics are characterized by a low dielectric constant, a relatively high dielectric breakdown voltage, and are substantially nonreactive with the circuitization and the circuitization processes. The polymeric dielectric materials are preferably curable at about 200 degrees Centigrade or lower.

The rerouting current lead 51 is formed of a dielectric 57, 59 encapsulated conductor 55 electrically joining the two surface features 53a, 53b. The dielectric 57, 59 encapsulated conductor 55 structure 51 includes a conformal, polymeric dielectric layer 57 adherent to a surface of the microelectronic circuit panel 11, with a deposited conductor 55 on the conformal, polymeric dielectric layer, and a conformal, polymeric dielectric overcoat layer 59 deposited atop the deposited conductor 55.

The method includes depositing (for example, screening) a conformal, polymeric, dielectric carrier coating 57 on the surface of the microelectronic circuit panel 11, depositing the conductive circuitization 55 atop the conformal, polymeric, dielectric carrier coating 57 on the surface of the panel 11, and depositing a second conformal, polymeric, dielectric coating 59 atop the conductive circuitization layer 55.

According to a particularly preferred exemplification of the invention the bottom dielectric is successively screened on as two or more layers, each individually screened and cured, one atop the other. The use of two or more sublayers 57 provides increased resistance to the development of short circuit paths between the deposited conductor 55 and the pre-existing surface circuitization 21 of the package. When two or more such sublayers are utilized, they are preferably about 0.5 to 0.7 mils thick.

According to a further embodiment of the invention, the rerouted circuitization 51 may be pre-formed as a lamination of two thermoset or thermoplastic polymeric layers 57, 59 with a conductor 55 therebetween. The land eyelets 53a, 53b are at the ends of the encapsulated conductor.

The invention provides an inexpensive, low cost method of and structure for making engineering changes and repairs to microelectronic circuit panels. In this way it is possible to effect engineering changes and wiring rerouting in the field, especially individual, customized engineering changes.

While the invention has been described with respect to certain preferred embodiments and exemplifications, it is not intended to limit the scope of the invention thereby, but solely by the claims appended hereto.

We claim:

1. A method of rerouting circuitization in a multilayer circuit panel having a first pair of conductive surface features at a surface thereof, said method comprising the steps of:
   A. depositing and curing at least one conformal, polymeric dielectric layer on the surface of the panel between a first surface feature and a second surface feature;
   B. thereafter depositing circuitization on the conformal, polymeric dielectric layer between the first surface feature and the second surface feature;
   C. providing terminators electrically in contact with the circuitization at the ends thereof over and in contact with the surface features; and
   D. thereafter depositing and curing a top layer of dielectric overlaying at least the deposited circuitization and the terminators.

2. The method of claim 1 comprising depositing circuitization chosen from the group consisting of Cu and Ag.

3. The method of claim 1 comprising depositing and curing a dielectric atop the deposited circuitization, said dielectric being chosen from the group consisting of epoxies, phenolics, and polyimides.

4. The method of claim 1 comprising successively depositing curing two bottom polymeric layers one atop the other.

5. The method of claim 1 comprising joining the rerouting terminators to land surface features.

6. The method of claim 1 comprising joining the rerouting terminators to surface mount device surface features.

7. The method of claim 1 comprising rerouting a second circuit between a second pair of surface features, said method including providing at least one conformal, polymeric dielectric layer between the second pair of surface features and overlaying at least a portion of the first rerouting; thereafter depositing circuitization the conformal, polymeric dielectric layer between the second pair of surface features; providing terminators electrically in contact with the conductive layer at the ends thereof over the second pair of surface features; and depositing and curing a second layer of dielectric overlaying at least the second circuitization and the second terminators.

* * * * *